(12) United States Patent
Niwayama et al.

(10) Patent No.: US 6,633,047 B2
(45) Date of Patent: Oct. 14, 2003

(54) APPARATUS AND METHOD FOR INTRODUCING IMPURITY

(75) Inventors: Masahiko Niwayama, Kyoto (JP); Hiroko Kubo, Yawata (JP); Kenji Yoneda, Kyoto-ahi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 23 days.

(21) Appl. No.: 10/184,939

(22) Filed: Jul. 1, 2002

(65) Prior Publication Data

US 2002/0166980 A1 Nov. 14, 2002

Related U.S. Application Data

(62) Division of application No. 09/243,797, filed on Feb. 3, 1999.

(30) Foreign Application Priority Data

Feb. 18, 1998 (JP) ............................................ 10-035590

(51) Int. Cl.$^7$ ............................................. H01J 37/317
(52) U.S. Cl. ........................ 250/492.21; 250/492.2; 250/251
(58) Field of Search ...................... 250/492.21, 492.2, 250/251

(56) References Cited

U.S. PATENT DOCUMENTS 4,088,799 A   5/1978   Kurtin
4,465,529 A   8/1984   Arima et al.
4,906,594 A   3/1990   Yoneda et al.
4,914,292 A * 4/1990   Tamai et al. ................. 250/251
4,916,082 A   4/1990   Lesk et al.
5,492,862 A   2/1996   Misumi
5,837,568 A   11/1998  Yoneda et al.
6,100,536 A * 8/2000   Ito et al. ................. 250/492.21
6,452,197 B1 * 9/2002  Ito ......................... 250/492.21

FOREIGN PATENT DOCUMENTS

JP    06-325724   11/1994
JP    07-014548   1/1995
JP    07-221306   8/1995
JP    09-320508   12/1997

OTHER PUBLICATIONS

Niwayama et al., "A study of charge neutralization method during high current ion implantation for ultra thin gate dielectrics", 1999, IEEE, pp. 598–601.

* cited by examiner

*Primary Examiner*—Nikita Wells
(74) *Attorney, Agent, or Firm*—Nixon Peabody LLP; Donald R. Studebaker

(57) ABSTRACT

An impurity introducing apparatus of the present invention includes: a system for introducing an impurity having charges into a target to be processed, the target being a semiconductor substrate or a film formed on the substrate; a system for supplying electrons into the target, the electrons canceling the charges of the impurity; and a system for controlling the maximum energy of the electrons supplied by the electron supply system at a predetermined value or less.

6 Claims, 10 Drawing Sheets

APPARATUS AND METHOD FOR INTRODUCING IMPURITY

BACKGROUND OF THE INVENTION

The present invention relates to apparatus and method for introducing controlled amounts of selected impurity atoms into a surface of a target.

As the number of VLSI devices, integrated with a drastically reduced size on a single chip, has been increasing, the thickness of a gate insulating film for an MOS transistor has been tremendously reduced these days. As for a device with a design rule of 0.5 µm, the thickness of a gate insulating film was once ordinarily set at about 10 nm. In a device now available with a design rule of 0.25µm, however, the thickness of the film is almost halved, i.e., about 5 nm. A gate insulating film with such a very small thickness is extremely sensitive to charge buildup damage caused by implantation of dopant ions into the gate electrode of the device.

Recently, in order to process a wafer of a much greater size satisfactorily and to increase a throughput sufficiently, the maximum density of a beam current for an ion implanter has been increased. However, if the density of a beam current, created during ion implantation, is increased, then a positive charge buildup phenomenon, resulting from an impacting ion beam, gets even more remarkable. Accordingly, to suppress such a phenomenon, the ability of supplying electrons should be improved for an electron supply system.

FIG. 10 illustrates a cross-sectional structure for a conventional impurity introducing apparatus. As shown in FIG. 10, a guide tube 12 is provided to face a wafer 11 held by a wafer holder 10. A tube bias is applied from a first voltage supply 13 to the guide tube 12. An ion beam 14, which has been generated by an ion beam generator (not shown), travels inside the guide tube 12 leftward to impinge on the surface of the wafer 11.

An arc chamber 16 is provided beside the guide tube 12 and includes a filament 17 therein. A filament voltage is applied from a second voltage supply 18 to both terminals of the filament 17. An arc voltage is applied from a third voltage supply 19 to between one of the terminals of the filament 17 and the arc chamber 16. And arc current is supplied from a current source 20 into the arc chamber 16.

Argon (Ar) gas, for example, is introduced from a gas feed system 21 into the arc chamber 16. By supplying the Ar gas or the like into the arc chamber 16 and applying respective predetermined voltages to the arc chamber 16 and to the filament 17, plasma is created inside the arc chamber 16. And electrons, included in the plasma created, are supplied into the guide tube 12 to have a certain energy distribution.

The guide tube 12, first, second and third voltage supplies 13, 18, 19, arc chamber 16, filament 17, current source 20 and gas feed system 21 constitute an electron supply system 22 for supplying electrons to be introduced into the wafer 11. The electrons 23, which have been supplied from the arc chamber 16 into the guide tube 12, are attracted to a positive ion beam 14 to be distributed around the beam 14 and introduced into the wafer 11 together with the beam 14. The other electrons, which have not been attracted to the vicinity of the ion beam 14, are also attracted and introduced into the wafer 11 by an electric field formed between the guide tube 12 and the wafer 11.

However, the present inventors found that, if ions were implanted into a gate electrode on the wafer 11 using this conventional impurity introducing apparatus, the smaller the thickness of a gate oxide film, the higher the percentage of dielectric breakdown caused in the gate oxide film.

FIGS. 11(a) and 11(b) illustrate relationships between the thickness of a gate oxide film and the percentage of breakdown caused in the film, in which ions are implanted into the gate electrode of an MOS transistor, exhibiting antenna effect, using the conventional impurity introducing apparatus. Herein, the "antenna effect" is a phenomenon that if the area of a gate electrode is set larger than that of a gate electrode actually formed in a transistor, then a gate insulating film is affected by the charge of ions and electrons to a higher degree. FIGS. 11(a) and 11(b) illustrate results obtained by implanting the ions into p- and n-type semiconductor substrates, respectively. In this case, $As^+$ ions are implanted under the conditions that accelerating voltage is 20 keV, implant dose is $5 \times 10^{15}/cm^2$ and a beam current is 10 mA. In the MOS transistor, the area of the gate insulating film is $1 \times 10^{-6}$ mm$^2$, the area of the gate electrode is $1 \times 10^{-1}$ mm$^2$, and the antenna ratio is $1 \times 10^5$.

In FIGS. 11(a) and 11(b), the abscissas indicate thicknesses of the gate oxide film, while the ordinates indicate percentages of breakdown caused in an MOS transistor exhibiting the antenna effect, where the breakdown voltage of the gate oxide film thereof is 8 MV/cm or less. FIGS. 11(a) and 11(b) also illustrate respective results obtained with the flux of electrons supplied from an electron supply system varied, where the respective fluxes of electrons are represented as 0.5, 1.0, 1.5 and 2.0 by normalizing the flux of electrons supplied under standard conditions at 1.0. As can be understood from FIGS. 11(a) and 11(b), the smaller the thickness of the gate oxide film, the higher the percentage of breakdown caused in the gate oxide film, even though the flux of electrons supplied from the electron supply system 22 remains the same.

SUMMARY OF THE INVENTION

A prime object of the present invention is preventing the percentage of breakdown caused in a gate insulating film from increasing even if the thickness of the film is reduced.

To achieve this object, an apparatus for introducing an impurity according to the present invention includes: means for introducing an impurity having charges into a target to be processed, which is a semiconductor substrate or a film formed on the substrate; means for supplying electrons into the target to cancel the charges of the impurity; and means for controlling the maximum energy of the electrons supplied by the electron supply means at a predetermined value or less.

The apparatus of the present invention includes the means for controlling the maximum energy of the electrons, supplied by the electron supply means, at a predetermined value or less. Accordingly, it is possible to prevent the target to be processed or the semiconductor substrate, on which the target is formed, from being negatively charged up.

In one embodiment of the present invention, the impurity introducing means is preferably means for implanting ions as the impurity.

In such an embodiment, it is possible to prevent a negative charge buildup phenomenon from being caused during the ion implantation.

In another embodiment of the present invention, if an insulating film with a thickness of t (nm) is formed on the semiconductor substrate, then the predetermined value is preferably 2 t (eV).

In such an embodiment, it is possible to prevent dielectric breakdown from being caused in the insulating film due to the negative charge buildup phenomenon.

In still another embodiment, the apparatus preferably further includes means for measuring the energy of the electrons supplied by the electron supply means.

In such an embodiment, the energy of the electrons supplied by the electron supply means can be known.

In such a case, the energy measuring means preferably includes means for measuring the maximum energy of the electrons supplied by the electron supply means.

Then, it is easier to control the maximum energy of the electrons, supplied by the electron supply means, at the predetermined value or less.

In an alternate embodiment, the energy measuring means preferably makes the control means control the maximum energy of the electrons, supplied by the electron supply means, at the predetermined value or less based on the measured energy of the electrons.

In such an embodiment, the maximum energy of the electrons, supplied by the electron supply means, can be automatically controlled at the predetermined value or less.

A method for introducing an impurity according to the present invention includes the steps of: introducing an impurity having charges into a target to be processed, which is a semiconductor substrate or a film formed on the substrate; and supplying electrons into the target to cancel the charges of the impurity. The step of supplying electrons includes the step of controlling the maximum energy of the electrons supplied at a predetermined value or less.

In accordance with the method of the present invention, the step of supplying electrons includes the step of controlling the maximum energy of the electrons supplied at a predetermined value or less. Accordingly, it is possible to prevent the target to be processed or the semiconductor substrate, on which the target is formed, from being negatively charged up.

In one embodiment of the present invention, the step of introducing an impurity preferably includes the step of implanting ions as the impurity.

In such an embodiment, it is possible to prevent a negative charge buildup phenomenon from being caused during the step of implanting ions.

In another embodiment of the present invention, if an insulating film with a thickness of t (nm) is formed on the semiconductor substrate, then the predetermined value is preferably 2 t (eV).

In such an embodiment, it is possible to prevent dielectric breakdown from being caused in the insulating film due to the negative charge buildup phenomenon.

In still another embodiment, the method preferably further includes the step of measuring the energy of the electrons supplied in the step of supplying electrons.

In such an embodiment, the energy of the electrons supplied in the step of supplying electrons can be known.

In this case, the step of measuring the energy preferably includes the step of measuring the maximum energy of the electrons supplied in the step of supplying electrons.

Then, it is easier to control the maximum energy of the electrons, supplied in the step of supplying electrons, at the predetermined value or less.

In an alternate embodiment, the step of measuring the energy preferably includes the step of controlling the maximum energy of the electrons, supplied in the step of supplying electrons, at the predetermined value or less based on the measured energy of the electrons.

In such an embodiment, the maximum energy of the electrons, supplied in the step of supplying electrons, can be automatically controlled at the predetermined value or less.

DESCRIPTION OF THE PREFERRED EMBODIMENTS

Hereinafter, an impurity introducing apparatus according to an exemplary embodiment of the present invention will be described with reference to FIG. 1. The apparatus of the present invention introduces controlled amounts of selected impurity atoms into a wafer 101 held on a wafer holder 100. According to the present invention, an electron supply system of any type may be provided for the apparatus. In the following embodiment, the apparatus of the present invention is provided with a plasma flood system for supplying electrons, which have been created from plasma, onto an orbit of an ion beam.

Figure 1:
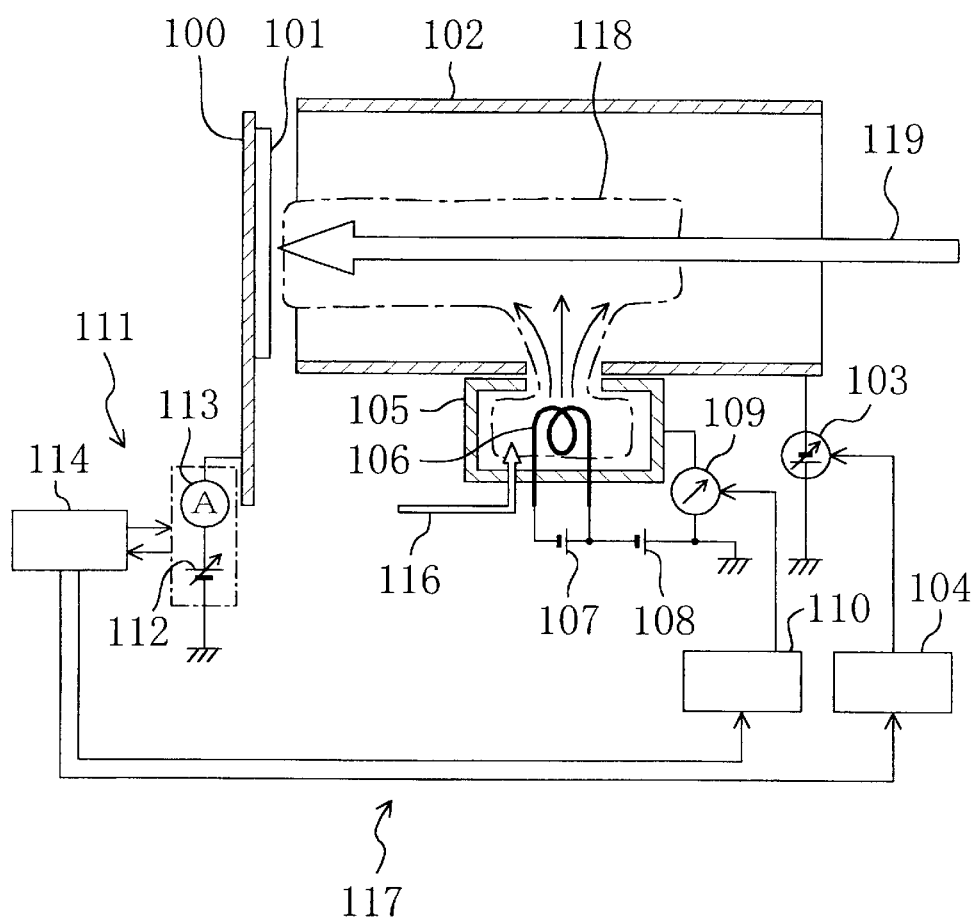
FIG. 1 is a schematic representation illustrating the overall arrangement of an impurity introducing apparatus according to an exemplary embodiment of the present invention.

As shown in FIG. 1, a guide tube 102 is provided to face the wafer 101 held on the wafer holder 100. A first voltage supply 103 for supplying a variable tube bias voltage to the guide tube 102 is connected to the guide tube 102. The level of the tube bias voltage, supplied from the first voltage supply 103, is controlled by a tube bias controller 104.

An arc chamber 105 is provided beside the guide tube 102 and includes a filament 106 therein. A filament voltage is applied from a second voltage supply 107 to both terminals of the filament 106. An arc voltage is applied from a third voltage supply 108 to between one of the terminals of the filament 106 and the arc chamber 105.

A current source 109 for supplying a variable arc current to the arc chamber 105 is connected to the arc chamber 105. The amount of the arc current, supplied from the current source 109, is controlled by an arc current controller 110.

An electron parameter sensor 111 for sensing the energy and flux of electrons supplied and introduced into the wafer 101 is provided for the wafer holder 100. The electron parameter sensor 111 includes: a variable voltage supply 112; an ammeter 113; and a wafer voltage controller 114. The variable voltage supply 112 supplies a voltage to the wafer holder 100 and the wafer 101 while varying the value thereof. The ammeter 113 measures the amount of a current flowing in the wafer holder 100 and the wafer 101. And the wafer voltage controller 114 controls the voltage supplied from the variable voltage supply 112 based on the value of the voltage supplied from the variable voltage supply 112 and the amount of current measured by the ammeter 113.

Argon (Ar) gas, for example, is introduced from a gas feed system 116 into the arc chamber 105. By supplying the Ar gas or the like into the arc chamber 105 and applying respective predetermined voltages to the arc chamber 105 and to the filament 106, plasma is created inside the arc chamber 105. And electrons, included in the plasma created, are supplied into the guide tube 102 to have a certain energy distribution.

The guide tube 102, first, second and third voltage supplies 103, 107, 108, tube bias controller 104, arc chamber 105, filament 106, current source 109, arc current controller 110, electron parameter sensor 111 and gas feed system 116 constitute an electron supply system 117. The electrons 118, which have been supplied from the arc chamber 105 into the guide tube 102, are attracted to a positive ion beam 119 and introduced into the wafer 101 together with the beam 119. The other electrons, which have not been attracted to the vicinity of the ion beam 119, are also attracted and introduced into the wafer 101 by an electric field formed between the guide tube 102 and the wafer 101.

As the arc current, flowing between the arc chamber 105 and the filament 106, increases, the density of the plasma, created inside the arc chamber 105, becomes higher. As a result, the flux of electrons supplied into the guide tube 102 also increases. On the other hand, if a higher tube bias voltage is applied to the guide tube 102, most of the electrons 118, supplied into the guide tube 102, come to have higher energy values.

Figure 2A:
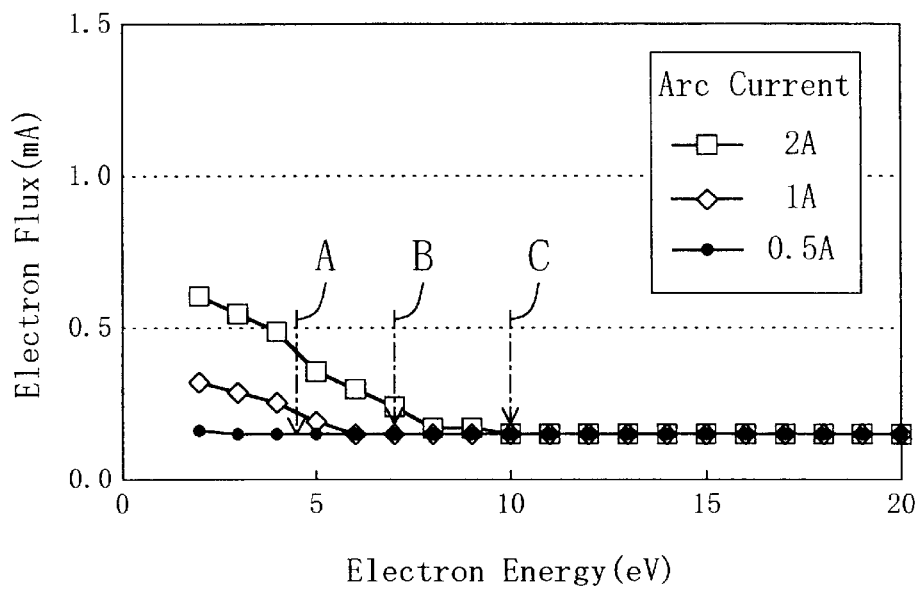
FIGS. 2(a) and 2(b) are graphs illustrating respective distributions of electron energies with arc current and tube bias voltage varied, respectively.

FIG. 2(a) illustrates the distribution of electron energy with an arc current varied. In FIG. 2(a), the axis of abscissas indicates the energy of electrons, while the axis of ordinates indicates the flux of electrons supplied. Arrows A, B and C indicate the individual maximum values of the electron energy associated with arc currents of 0.5 A, 1 A and 2 A, respectively. These maximum values can be defined as such because the energy higher than the respective values identified by the arrows A, B and C can be regarded as noise.

Figure 2B:
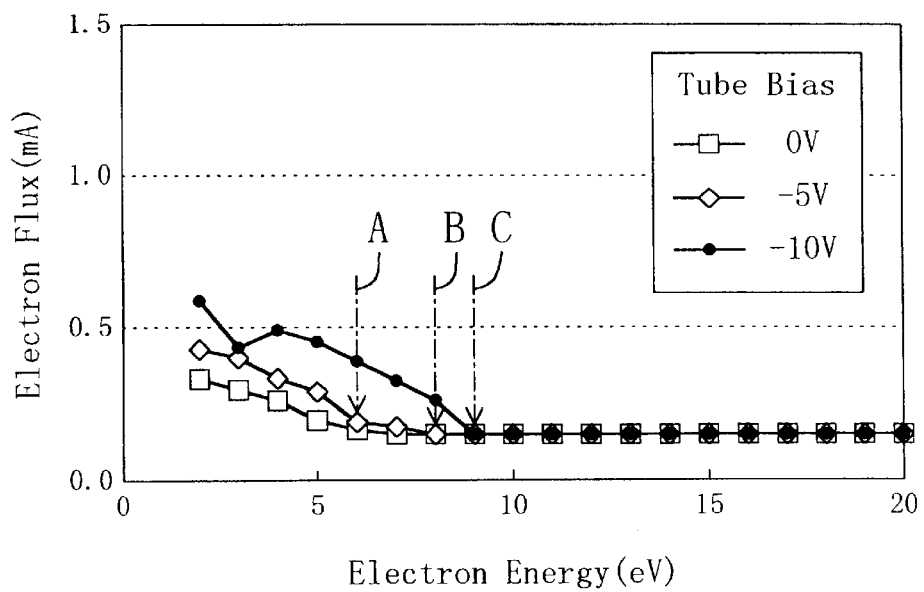

FIG. 2(b) illustrates the distribution of electron energy variable with a tube bias voltage applied. In FIG. 2(b), the axis of abscissas indicates the energy of electrons, while the axis of ordinates indicates the flux of electrons supplied. Arrows A, B and C indicate the individual maximum values of the electron energy associated with tube bias voltages of 0 V, −5 V and −10 V, respectively. These maximum values can be defined as such because the energy higher than the respective values identified by the arrows A, B and C can be regarded as noise.

As can be understood from FIG. 2(a), the larger the arc current, the larger the total flux of electrons supplied and the higher the maximum energy of electrons. Also, as can be seen from FIG. 2(b), the lower the tube bias voltage (−10 V being herein regarded as lower than 0 V), the higher the maximum energy of electrons.

Accordingly, if an arc current and a tube bias voltage are changed, then the maximum energy and total flux of electrons introduced into a wafer can be changed.

Figure 3:
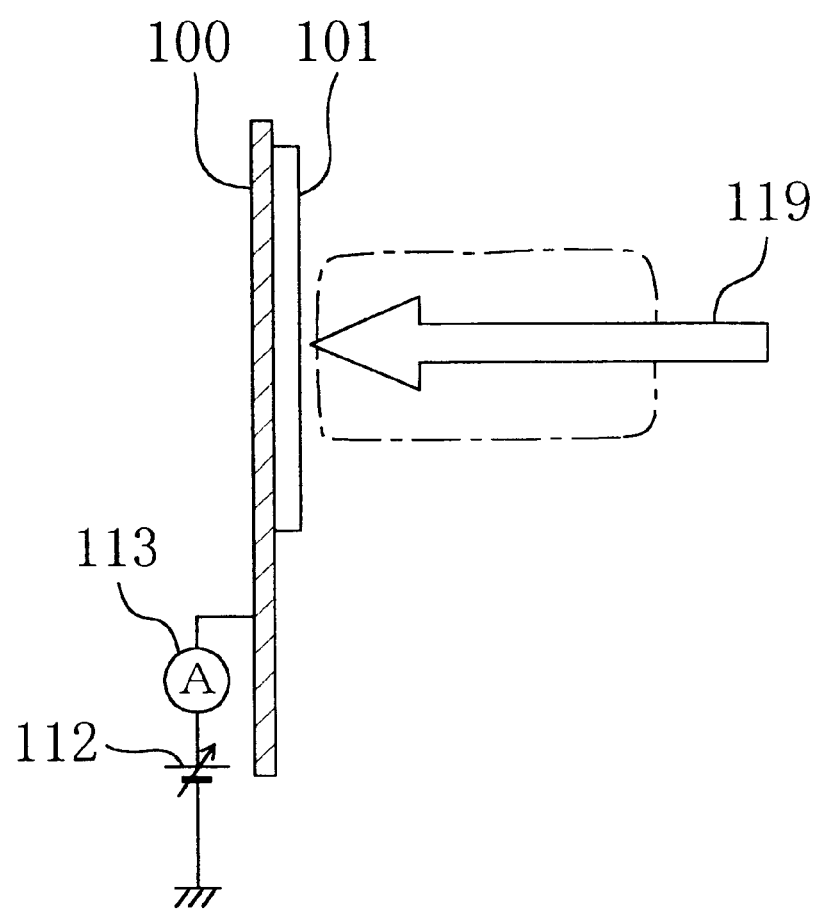
FIG. 3 is a schematic representation illustrating how energy and flux of electrons supplied from an electron supply system are measured.

Next, it will be described with reference to FIG. 3 how the energy and flux of electrons supplied from the electron supply system 117 are measured.

The ammeter 113 measures a total of the flux of electrons, included in the ion beam 119 and implanted into the wafer 101, and the flux of electrons, supplied from the arc chamber 105 into the guide tube 118 and then introduced into the wafer 101.

As the voltage applied from the variable voltage supply 112 to the wafer holder 100 is increased, the amount of the current measured by the ammeter 113 decreases, because electrons, having energy lower than the applied voltage, can no longer reach the wafer holder 100.

Accordingly, the amount of current flowing in the ammeter 113 is measured with the voltage applied to the wafer holder 100 increased at regular intervals. That is to say, an amount of current, associated with a predetermined voltage applied, is measured. And based on the amount of current associated with the predetermined voltage applied, a flux of electrons associated with a predetermined energy range can be calculated.

Figure 4A:
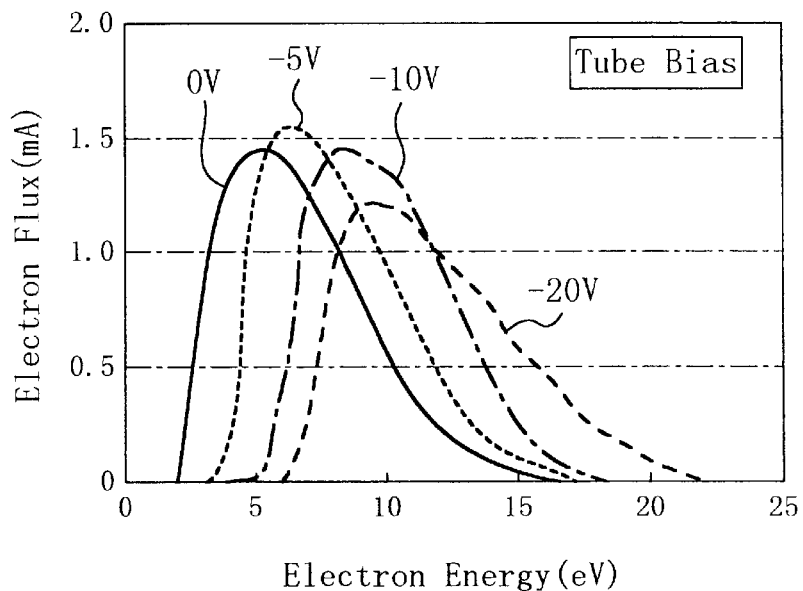
FIGS. 4(a) and 4(b) are graphs illustrating respective relationships between the energy and flux of electrons supplied, where ions are implanted with tube bias voltage and arc current varied, respectively.
Figure 4B:
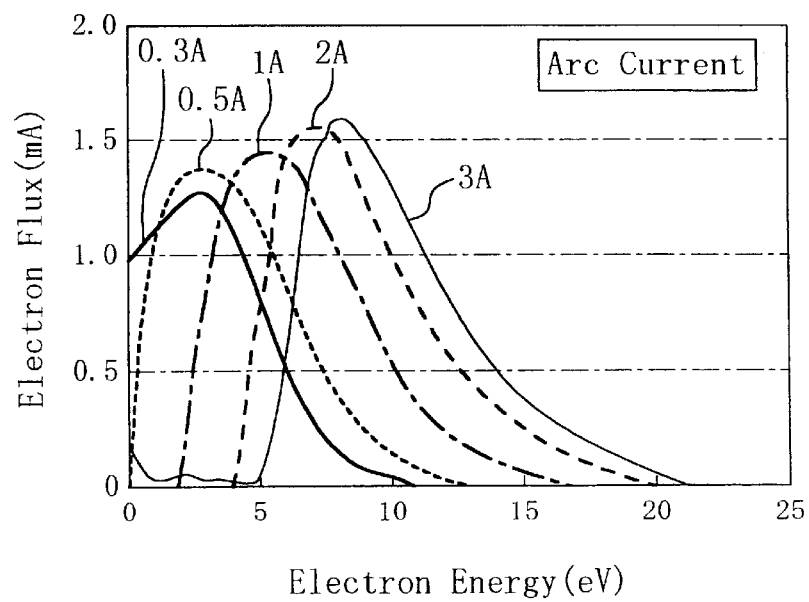

FIG. 4(a) illustrates a relationship between the energy and flux of electrons supplied, where ions are implanted with a tube bias voltage varied. In this case, As$^+$ ions are implanted under the conditions that accelerating voltage is 20 keV, beam current is 10 mA and arc current is 1 A. FIG. 4(b) illustrates a relationship between the energy and flux of electrons supplied, where ions are implanted with an arc current varied. In this case, As$^+$ ions are implanted under the conditions that accelerating voltage is 20 keV, beam current is 10 mA and tube bias voltage is 0 V.

As can be understood from FIG. 4(a), the lower the tube bias voltage, the higher the peak energy (i.e., energy of electrons associated with the maximum flux of electrons, or the maximum ordinate) and the maximum energy of electrons supplied (i.e., the maximum abscissa). The flux of electrons associated with the peak energy is the largest when the tube bias voltage is −5 V, but the total flux of electrons supplied (i.e., an integrated value of the fluxes of electrons) is substantially constant.

As can be seen from FIG. 4(b), as the arc current increases, both the maximum energy and the total flux of electrons supplied increase.

Next, it will be described how the percentage of breakdown caused in a gate oxide film changes if the maximum energy and total flux of electrons, introduced into a wafer, are changed by changing an arc current and a tube bias voltage. As$^+$ ions are herein implanted into a gate electrode of an MOS transistor, exhibiting an antenna effect, under the conditions that accelerating voltage is 20 keV, implant dose is $5 \times 10^{15}/cm^2$ and beam current is 10 mA. In the MOS transistor used for the ion implantation, p- and n-type substrates are used, a gate insulating film has an area of $1 \times 10^{-6}$ mm$^2$, the gate electrode has an area of $1 \times 10^{-1}$ mm$^2$ and the antenna ratio is $1 \times 10^5$.

Figure 5A:
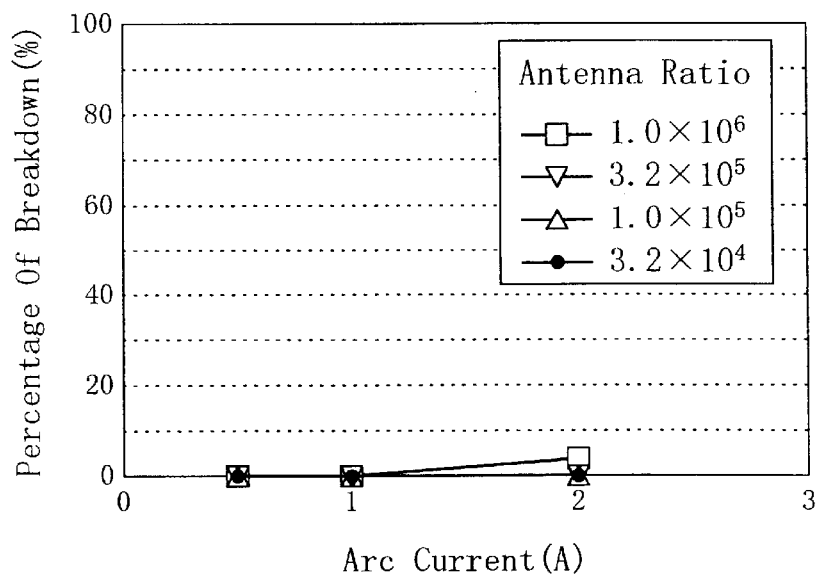
FIGS. 5(a) and 5(b) are graphs illustrating respective relationships between an arc current and the percentage of breakdown caused in a gate oxide film on p- and n-type semiconductor substrates, respectively, to which ions are implanted with the arc current varied.
Figure 5B:
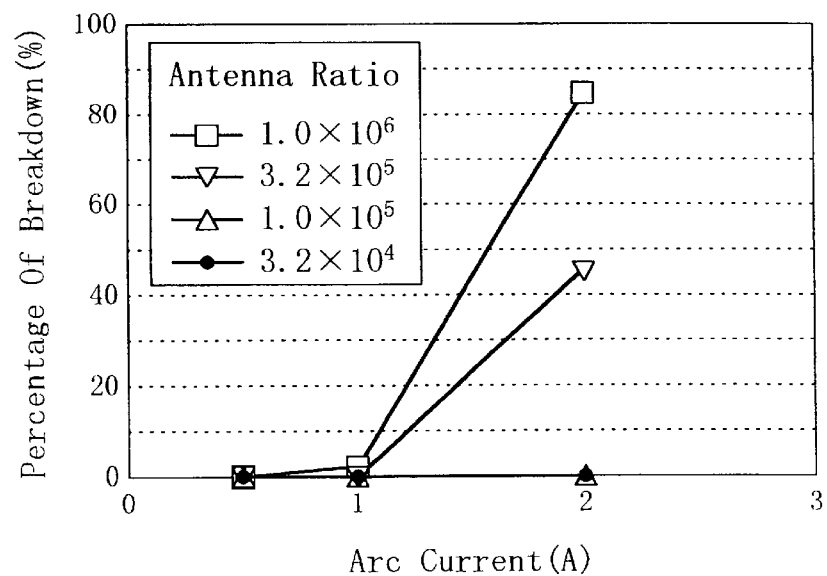

FIG. 5(a) illustrates a relationship between an arc current and the percentage of breakdown caused in a gate oxide film, which is formed on a p-type semiconductor substrate to have a thickness of 5.0 nm and to which ions are implanted with the arc current varied. In this case, the ions are implanted under the conditions that tube bias voltage is 0 V and beam current is 10 mA. FIG. 5(b) illustrates a relationship between an arc current and the percentage of breakdown caused in a gate oxide film, which is formed on an n-type semiconductor substrate to have a thickness of 5.0 nm and to which ions are implanted with the arc current varied. In this case, the ions are implanted under the conditions that tube bias voltage is 0 V and beam current is 10 mA.

As can be understood from FIGS. 5(a) and 5(b), the larger the arc current, the higher the percentage of breakdown caused in the gate oxide film. Thus, considering this and the above characteristics (i.e., the total flux and maximum energy of electrons supplied increase with the arc current) in combination, if the total flux or maximum energy of electrons supplied increases, then breakdown happens in the gate oxide film with a higher percentage.

Figure 6A:
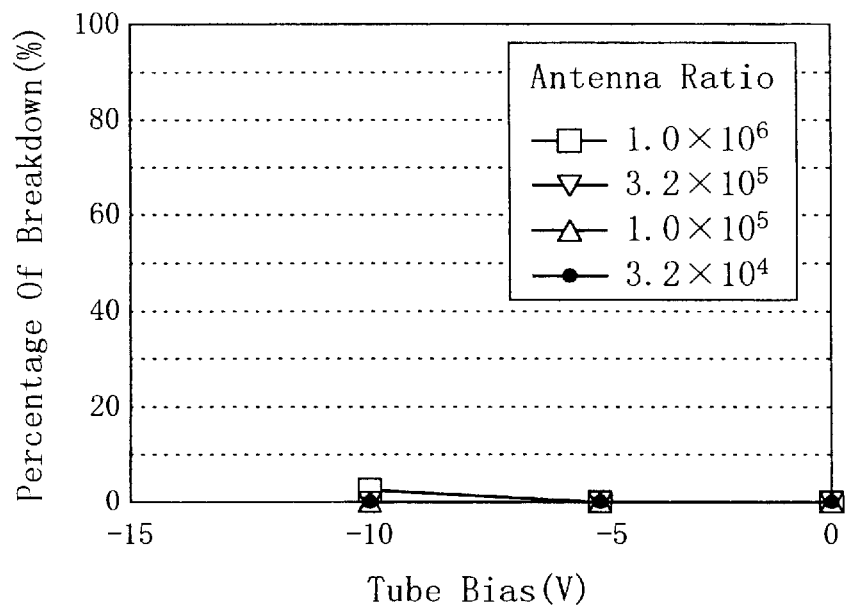
FIGS. 6(a) and 6(b) are graphs illustrating respective relationships between a tube bias voltage and the percentage of breakdown caused in a gate oxide film on p- and n-type semiconductor substrates, respectively, to which ions are implanted with the tube bias voltage varied.
Figure 6B:
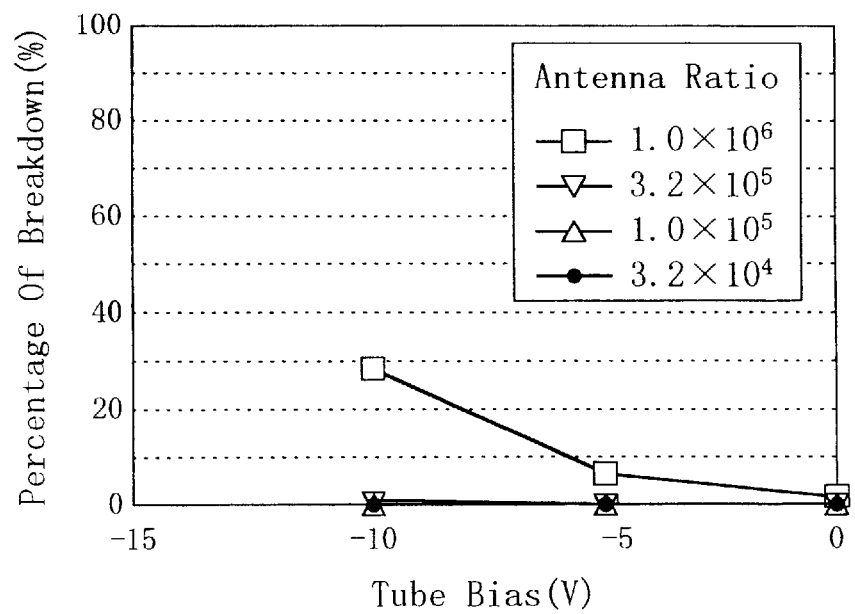

FIG. 6(a) illustrates a relationship between a tube bias voltage and the percentage of breakdown caused in a gate oxide film, which is formed on a p-type semiconductor substrate to have a thickness of 5.0 nm and to which ions are implanted with the tube bias voltage varied. In this case, the ions are implanted under the conditions that arc and beam currents are 1 A and 10 mA, respectively. FIG. 6(b) illustrates a relationship between a tube bias voltage and the percentage of breakdown caused in a gate oxide film, which is formed on an n-type semiconductor substrate to have a thickness of 5.0 nm and to which ions are implanted with the tube bias voltage varied. In this case, the ions are implanted under the conditions that arc and beam currents are 1 A and 10 mA, respectively.

As can be understood from FIGS. 6(a) and 6(b), the lower the tube bias voltage (−15 V being herein regarded as lower than 0 V), the higher the percentage of breakdown caused in the gate oxide film. Thus, considering this and the above characteristics (i.e., the maximum energy of electrons increases as the tube bias voltage decreases) in combination, as the maximum energy of electrons supplied increases, the breakdown happens in the gate oxide film with a higher percentage.

Accordingly, as described with reference to FIGS. 5(a), 5(b), 6(a) and 6(b), if the total flux or the maximum energy of electrons supplied increases, then the breakdown happens in the gate oxide film with a higher percentage.

Next, a relationship between the maximum energy of electrons and the percentage of breakdown caused in a gate oxide film will be described.

Figure 7:
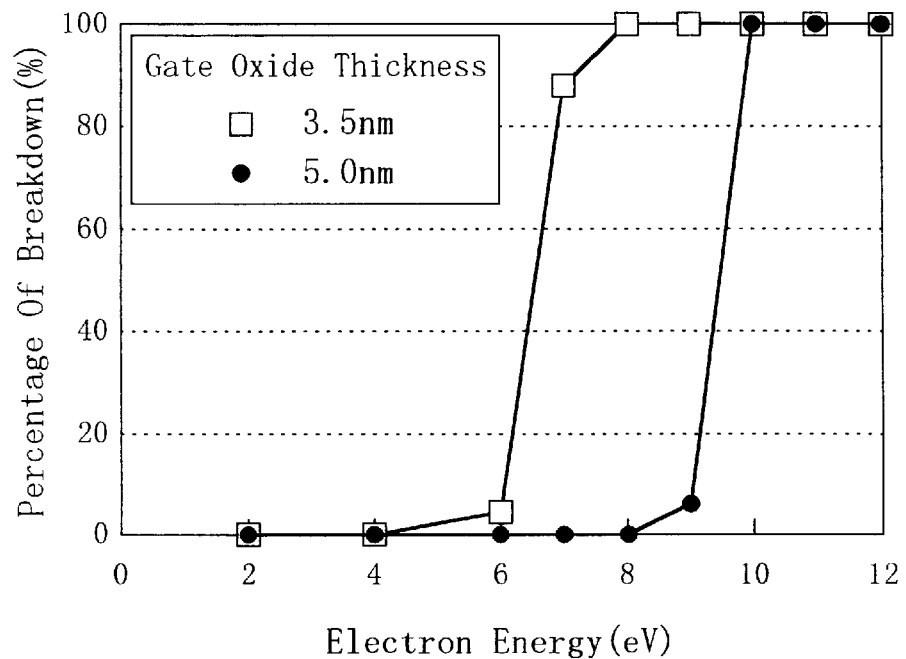
FIG. 7 is a graph illustrating a relationship between the maximum energy of electrons supplied by an electron supply system and the percentage of breakdown caused in a gate oxide film.

FIG. 7 illustrates respective relationships between the maximum energy of electrons supplied from an electron supply system and the percentage of breakdown caused in a gate oxide film, the thickness of which is set at 3.5 and 5.0 nm, respectively. As can be understood from FIG. 7, the higher the maximum energy of electrons, the higher the percentage of breakdown caused in the gate oxide film. As also can be seen from FIG. 7, if the thickness of the gate oxide film is 5.0 nm, breakdown never fails to happen in the film when electrons having energy of 10 eV or more are introduced thereto. On the other hand, if the thickness of the gate oxide film is 3.5 nm, breakdown never fails to happen in the film when electrons having energy of 7 eV or more are introduced thereto.

Next, a relationship between the thickness of a gate oxide film and the maximum energy of electrons at which breakdown happens in the gate oxide film will be described. As$^+$ ions are herein implanted into the gate oxide film of an MOS transistor, exhibiting an antenna effect, with the thickness of the gate oxide film varied, under the conditions that accelerating voltage is 20 keV, implant dose is $5 \times 10^{15}/\text{cm}^2$ and beam current is 10 mA. In the MOS transistor, p- and n-type substrates are used, a gate insulating film has an area of $1 \times 10^{-6} \text{mm}^2$, the gate electrode has an area of $1 \times 10^{-1} \text{mm}^2$ and the antenna ratio is $1 \times 10^5$.

Figure 8:
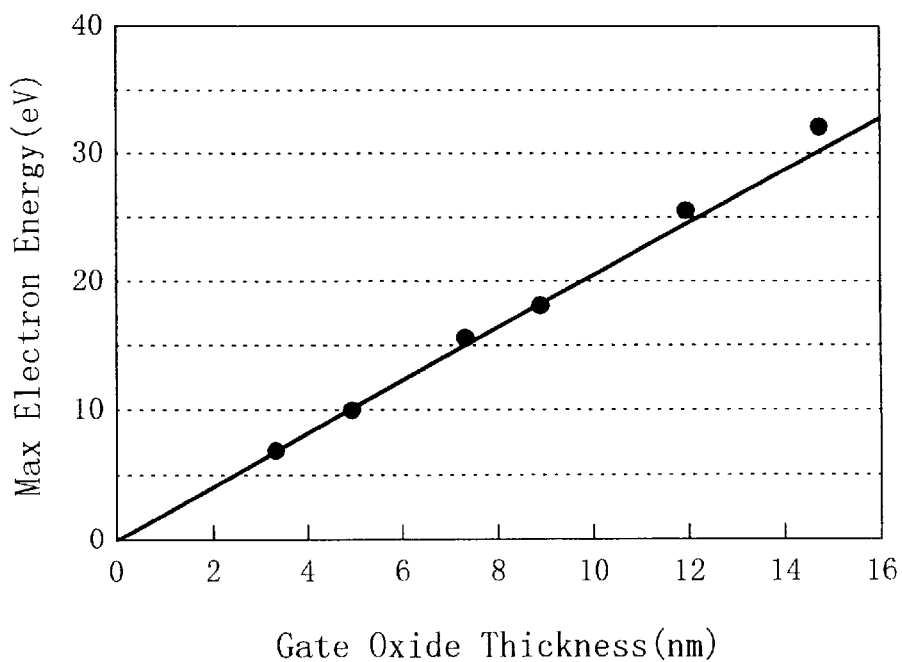
FIG. 8 is a graph illustrating a relationship between the thickness of a gate oxide film and the maximum energy of electrons at which breakdown happens in the gate oxide film.

FIG. 8 illustrates a relationship between the thickness of a gate oxide film and the maximum energy of electrons at which breakdown happens in the film. As can be understood from FIG. 8, the breakdown happens in the gate oxide film when the maximum energy of electrons is approximately 2 (eV/nm)×t (nm)=2 t (eV). That is to say, electrons having energy of 2 t (eV) cause a breakdown in the gate oxide film.

Based on these results, it can be understood that a negative charge buildup phenomenon caused in a gate oxide film upon the introduction of electrons depends on the maximum energy of the electrons introduced into the film. Accordingly, if the maximum energy of the electrons introduced is controlled at a predetermined value or less, then the charge buildup phenomenon in the gate oxide film can be suppressed.

Next, the relationship between the flux of electrons supplied and the percentage of breakdown caused in a gate oxide film will be examined. In the following description, the breakdown state of a gate oxide film will be analyzed while controlling the maximum energy of electrons supplied from an electron supply system at a predetermined value or less and changing the flux of electrons supplied.

The relationship between the flux of electrons supplied and the percentage of breakdown caused in a gate oxide film is analyzed under the following conditions. As$^+$ ions are herein implanted into the gate oxide film of an MOS transistor, exhibiting an antenna effect, with the thickness of the film varied, under the conditions that accelerating voltage is 20 keV, implant dose is $5 \times 10^{-5}/\text{cm}^2$ and beam current is 10 mA. In the MOS transistor, p- and n-type substrates are used, a gate insulating film has an area of $1 \times 10^{-6}$ mm$^2$, the gate electrode has an area of $1 \times 10^{-1}$ mm$^2$ and the antenna ratio is $1 \times 10^5$.

Figure 9:
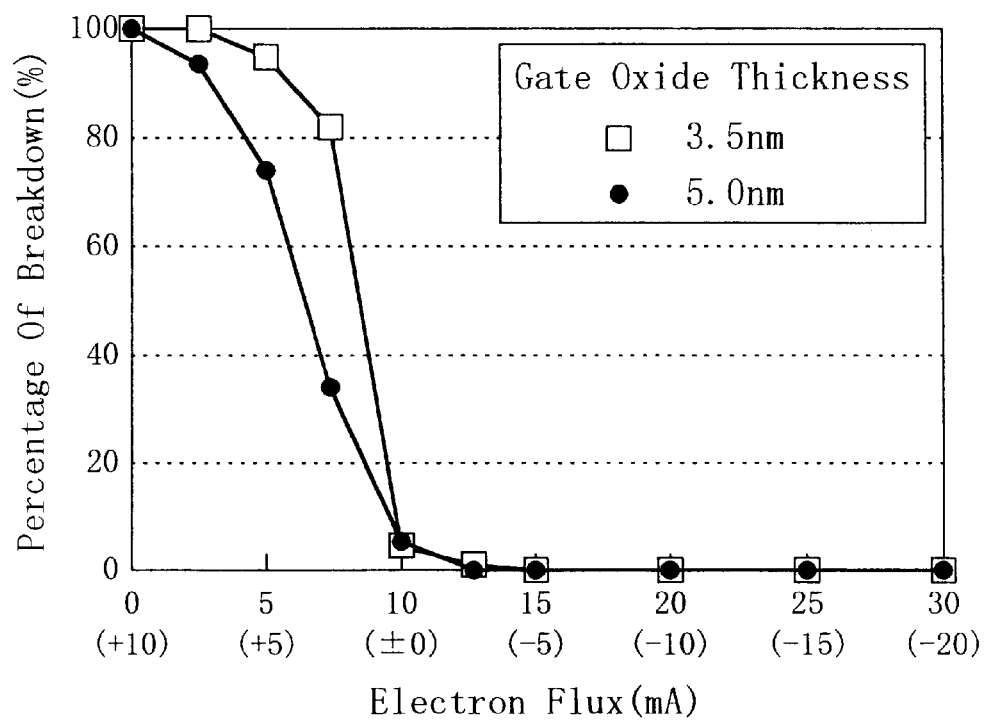
FIG. 9 is a graph illustrating a relationship between the flux of electrons supplied and the percentage of breakdown caused in a gate oxide film.
Figure 10:
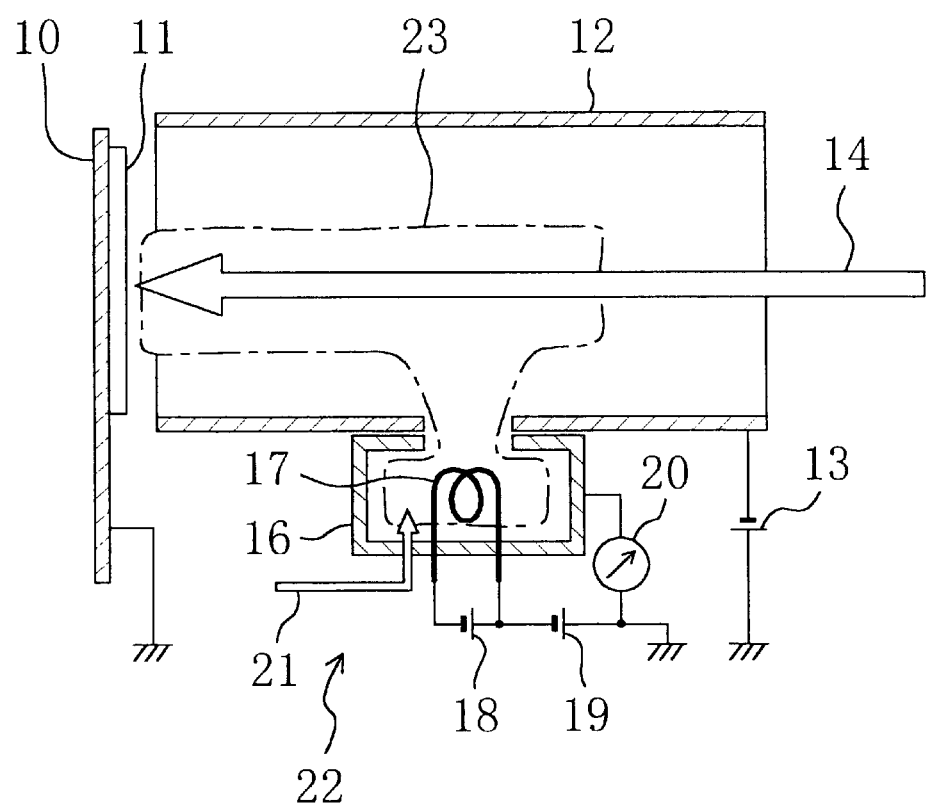
FIG. 10 is a schematic representation illustrating the overall arrangement of a conventional impurity introducing apparatus.
Figure 11A:
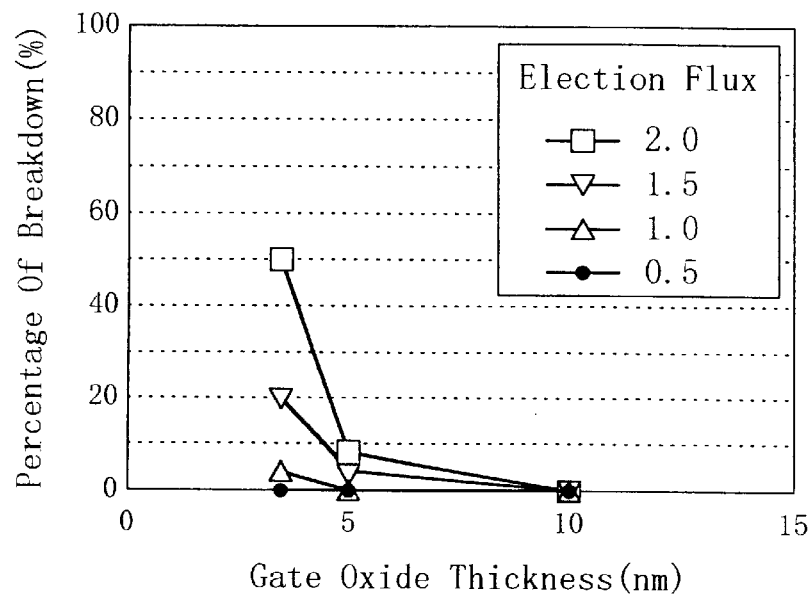
FIGS. 11(a) and 11(b) are graphs illustrating respective relationships between the thickness of a gate insulating film and the percentage of breakdown, where ions are implanted into p- and n-type semiconductor substrates, respectively.
Figure 11B:
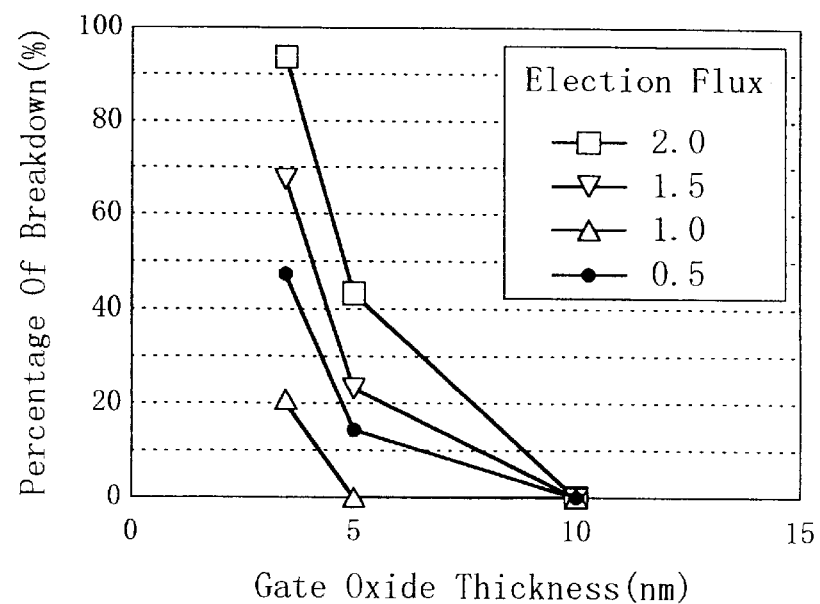

FIG. 9 illustrates a relationship between the flux of electrons supplied and the percentage of breakdown caused in a gate oxide film. On the axis of abscissas, 0, 5, 10, 15, 20, 25 and 30 indicate respective fluxes of electrons supplied and each numeral in parentheses indicates an apparent amount of current on a wafer. That is to say, the numeral indicates a total of the flux of electrons supplied from an electron supply system and the amount of beam current. In this case, if the amount of current is a positive value, then the flux of electrons is a negative value. Accordingly, the numeral indicates in actuality a difference obtained by subtracting the flux of electrons from the amount of beam current. As can be understood from FIG. 9, if the flux of electrons is equal to or smaller than 10 mA (i.e., if the apparent amount of current is equal to or larger than 0 mA), breakdown is very likely to happen in the gate oxide film. On the other hand, if the flux of electrons exceeds 10 mA (i.e., if the apparent amount of current is smaller than 0 mA), breakdown rarely happens in the gate oxide film. And even if the flux of electrons is as large as 30 mA, breakdown hardly happens in the gate oxide film.

These results tell that the breakdown in the gate oxide film has nothing to do with the flux of electrons supplied, but is caused by a charge buildup phenomenon resulting from positive charges of the ion beam.

As is apparent from the foregoing description, the following conclusions can be drawn:

(1) The charge buildup phenomenon happening in a gate oxide film depends on the maximum energy of electrons introduced into the gate oxide film;

(2) The charge buildup phenomenon does not happen in the gate oxide film if the maximum energy of electrons is approximately 2 t (eV) or less;

(3) The charge buildup phenomenon does not happen in the gate oxide film if only electrons of such a flux as to neutralize the beam current are supplied; and (4) As long as the maximum energy of electrons is too low to cause the charge buildup phenomenon in a gate oxide film, the phenomenon does not happen in the film even though the flux of electrons has increased.

Thus, by adjusting arc current and bias voltage, supplied to the guide tube by an electron supply system, to control the maximum energy of electrons supplied at a value determined by the thickness of a gate oxide film or less, breakdown, happening in the gate oxide film due to the negative charge buildup phenomenon, can be suppressed.

During an actual manufacturing process of devices, supposing the thickness of a gate oxide film is t (nm), it is possible to prevent breakdown from being caused in the gate oxide film due to the negative charge buildup phenomenon so long as the maximum energy of electrons supplied is approximately 2 (eV/nm)×t (nm)=2 t (eV) or less.

A conventional ion implanter does not have any function of measuring the energy and flux of electrons supplied before, during and after ion implantation. Thus, the energy of electrons during the ion implantation cannot be known using such an apparatus. Also, since the energy and flux of electrons supplied are unknown, the variation in flux of electrons supplied resulting from the variation in state of the ion implanter cannot be appropriately dealt with, which might also cause breakdown in a gate oxide film due to the charge buildup phenomenon.

In contrast, the apparatus of the invention includes: the electron parameter sensor 111 including variable voltage supply 112, ammeter 113 and wafer voltage controller 114; the tube bias controller 104 for controlling the level of the tube bias voltage supplied from the first voltage supply 103; and the arc current controller 110 for controlling the amount of the arc current supplied from the current source 109. Accordingly, the apparatus of the present invention can control the maximum energy of electrons supplied from the electron supply system 117 at a predetermined value or less, thus preventing the breakdown in a gate oxide film due to the charge buildup phenomenon.

The respective operations of the electron parameter sensor 111, tube bias controller 104 and arc current controller 110 and the reason why the breakdown, resulting in a gate oxide film from the negative charge buildup phenomenon, can be prevented in this embodiment without fail, will be described.

First, before ions are implanted, the ion beam and electrons are introduced into the wafer holder 100 under the same conditions as those for the ion implantation. In this case, as the voltage applied from the variable voltage supply 112 is increased, the amount of current measured by the ammeter 113 decreases, because electrons, having energy lower than the applied voltage, cannot reach the wafer holder 100. Accordingly, the amount of current is measured by the ammeter 113 with the voltage applied from the variable voltage supply 112 increased at regular intervals, thereby calculating values of current associated with respective applied voltages. And based on the values of current associated with the respective applied voltages, fluxes of electrons within respective energy ranges are calculated. Also, in this case, an integrated value of the fluxes of electrons within respective energy ranges is calculated to derive the total flux of electrons supplied and the maximum energy of electrons.

Next, suppose the maximum energy of electrons, supplied from the electron supply system 117, is higher than the predetermined energy, at which the breakdown happens in the gate oxide film and which is determined by the thickness of the film in the device as a target of ion implantation. Then, the wafer voltage controller 114 outputs control signals to the tube bias and arc current controllers 104, 110, thereby reducing the level of the tube bias voltage supplied from the first voltage supply 103 and the amount of the arc current supplied from the current source 109.

By repeatedly performing this operation until the maximum energy of electrons supplied from the electron supply system 117 reaches the predetermined energy (i.e., the maximum energy below which no breakdown happens in the gate oxide film), the breakdown, resulting from the charge buildup phenomenon in the film, can be prevented.

In this case, if the wafer voltage controller 114 can sense the thickness of the gate oxide film in the device as a target of ion implantation, then the controller 114 can repeatedly output control signals to the tube bias and arc current controllers 104, 110 until the maximum energy of electrons is equal to or lower than the predetermined energy. Accordingly, the breakdown, resulting from the charge buildup phenomenon in the gate oxide film, can be automatically prevented.

In the foregoing embodiment, $As^+$ ions are implanted under the conditions that accelerating voltage is 20 kev, implant dose is $5 \times 10^{15}/cm^2$ and beam current is 10 mA. The ion implantation conditions, however, are not limited to these exemplified ones, but may be appropriately modified in terms of ion species, accelerating voltage, implant dose and value of beam current.

Also, in this embodiment, an MOS transistor exhibiting an antenna effect is used as an exemplary target device, in which the percentage of breakdown, resulting from a charge buildup phenomenon in the gate oxide film thereof, should be measured. Alternatively, any other transistor may be used so long as the transistor includes a gate electrode.

Moreover, in this embodiment, the energy and flux of electrons supplied by the electron supply system can be controlled using arc current and tube bias voltage as parameters. The present invention, however, is naturally applicable to a control over the energy and flux of electrons supplied by the electron supply system using any parameters other than arc current and tube bias voltage.

Furthermore, any electron supply system other than the exemplified one, which supplies electrons, created from plasma, onto an orbit of an ion beam, may be used so long as the system can control the parameters used for controlling the energy of electrons.

What is claimed is:

1. An apparatus for introducing an impurity comprising:
    means for introducing impurity ions having charges into a target to be processed, the target is composed of a film provided on an insulating film with a thickness of t(nm) and the insulating film is formed on a substrate;
    means for supplying electrons into the target, the electrons canceling the charges of the impurity ions; and
    means for controlling the maximum energy value of the electrons supplied by the electron supply means at 2 t(eV) or less.

2. The apparatus of claim 1, wherein the impurity introducing means is means for implanting ions as the impurity.

3. The apparatus of claim 1, further comprising means for measuring the energy of the electrons supplied by the electron supply means.

4. The apparatus of claim 3, wherein the energy measuring means comprises means for measuring the maximum energy of the electrons supplied by the electron supply means.

5. The apparatus of claim 3, wherein the energy measuring means makes the control means control the maximum energy value of the electrons, supplied by the electron supply means, at 2 t(eV) or less based on the measured energy of the electrons.

6. The apparatus of claim 3 further comprising an arc chamber provided beside a guide tube; and a filament provided in the arc chamber, wherein the measuring means measures the energy value of the electrons supplied by changing the voltage applied to the semiconductor substrate, and wherein the control means, based on the measured energy value of the elctrons, controls the maximum energy value of the electrons supplied to the target by changing an arc current supplied to the filament and a tube bias voltage applied to the guide tube.

* * * * *